(12) United States Patent
Sharan et al.

(10) Patent No.: US 11,031,288 B2
(45) Date of Patent: Jun. 8, 2021

(54) PASSIVE COMPONENTS IN VIAS IN A STACKED INTEGRATED CIRCUIT PACKAGE

(71) Applicant: Intel Corporation, Santa Clara, CA (US)

(72) Inventors: Sujit Sharan, Chandler, AZ (US); Ravindranath Mahajan, Chandler, AZ (US); Stefan Rusu, Sunnyvale, CA (US); Donald S. Gardner, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/252,420

(22) Filed: Jan. 18, 2019

(65) Prior Publication Data

US 2019/0157152 A1 May 23, 2019

Related U.S. Application Data

(62) Division of application No. 14/583,015, filed on Dec. 24, 2014, now Pat. No. 10,236,209.

(51) Int. Cl.
*H01L 21/78* (2006.01)
*H01L 23/48* (2006.01)
(Continued)

(52) U.S. Cl.
CPC ............ *H01L 21/78* (2013.01); *H01L 23/481* (2013.01); *H01L 23/5223* (2013.01);
(Continued)

(58) Field of Classification Search
CPC . H01L 2225/06541; H01L 2225/06555; H01L 23/3114; H01L 23/481;
(Continued)

(56) References Cited

U.S. PATENT DOCUMENTS

| 5,336,921 A | 8/1994 | Sundaram |
| 5,576,680 A | 11/1996 | Ling |

(Continued)

FOREIGN PATENT DOCUMENTS

| JP | 200619455 | 1/2006 |
| TW | 201428911 | 7/2014 |

OTHER PUBLICATIONS

Office Action for German Patent Application No. 102015119892.4 dated Jul. 13, 2018, 8 pgs., no translation.

(Continued)

*Primary Examiner* — Shuan M Campbell
(74) *Attorney, Agent, or Firm* — Schwabe, Williamson & Wyatt, P.C.

(57) ABSTRACT

Integrated passive components in a stacked integrated circuit package are described. In one embodiment an apparatus has a substrate, a first die coupled to the substrate over the substrate, the first die including a power supply circuit coupled to the substrate to receive power, a second die having a processing core and coupled to the first die over the first die, the first die being coupled to the power supply circuit to power the processing core, a via through the first die, and a passive device formed in the via of the first die and coupled to the power supply circuit.

18 Claims, 6 Drawing Sheets

(51) Int. Cl.
*H01L 23/522* (2006.01)
*H01L 25/16* (2006.01)
*H01L 49/02* (2006.01)
*H01L 23/538* (2006.01)

(52) U.S. Cl.
CPC .......... *H01L 23/5227* (2013.01); *H01L 25/16* (2013.01); *H01L 28/00* (2013.01); *H01L 23/5384* (2013.01); *H01L 2224/0401* (2013.01); *H01L 2224/05009* (2013.01); *H01L 2224/05548* (2013.01); *H01L 2224/13025* (2013.01); *H01L 2224/16146* (2013.01); *H01L 2224/16227* (2013.01); *H01L 2224/1703* (2013.01); *H01L 2224/17181* (2013.01); *H01L 2224/32145* (2013.01); *H01L 2224/73204* (2013.01); *H01L 2225/06513* (2013.01); *H01L 2225/06517* (2013.01); *H01L 2225/06541* (2013.01); *H01L 2225/06589* (2013.01); *H01L 2924/15311* (2013.01); *H01L 2924/18161* (2013.01)

(58) Field of Classification Search
CPC ............. H01L 23/5223; H01L 23/5227; H01L 21/76898; H01L 21/78; H01L 25/18; H01L 25/0657; H01L 25/50
See application file for complete search history.

(56) References Cited

U.S. PATENT DOCUMENTS

| | | | | |
|---|---|---|---|---|
| 6,417,754 | B1* | 7/2002 | Bernhardt | ............... H01F 5/003 257/E21.022 |
| 9,041,152 | B2 | 5/2015 | Luo | |
| 9,159,778 | B2 | 10/2015 | Wang | |
| 2006/0001174 | A1 | 1/2006 | Maisui Satoshi | |
| 2007/0070673 | A1 | 3/2007 | Borkar et al. | |
| 2009/0090995 | A1* | 4/2009 | Yang | .................. H01L 23/5225 257/531 |
| 2009/0296360 | A1 | 12/2009 | Doblar | |
| 2010/0013452 | A1 | 1/2010 | Tang | |
| 2010/0172065 | A1* | 7/2010 | Huang | ..................... H01G 4/10 361/313 |
| 2013/0037965 | A1 | 2/2013 | Morimoto | |
| 2013/0058067 | A1 | 3/2013 | Yee | |
| 2014/0092574 | A1* | 4/2014 | Zillmann | .............. G06F 1/3296 361/782 |
| 2014/0104288 | A1 | 4/2014 | Shenoy | |
| 2014/0225706 | A1 | 8/2014 | Doyle | |
| 2015/0255372 | A1* | 9/2015 | Kamgaing | ............ H01L 23/481 257/415 |
| 2015/0255529 | A1* | 9/2015 | Wang | ..................... H01L 28/10 257/531 |
| 2015/0303174 | A1* | 10/2015 | Yu | ........................ H01L 21/6835 257/712 |
| 2015/0325520 | A1 | 11/2015 | Yu | |

OTHER PUBLICATIONS

Office Action for Japanese Patent Application No. 2015-223148 dated Nov. 8, 2016, 3 pages.
Decision of Grant from Japanese Patent Application No. 2015-223148, dated Jul. 7, 2017, 2 pgs., no translation.
Office Action from Korean Patent Application No. 10-2015-0163793, dated Dec. 14, 2016, 13 pages, no translation.
Office Action from Korean Patent Application No. 10-2015-0163793 dated Jun. 23, 2017, 5 pages.
Office Action and Search Report for Taiwan Patent Application No. 104138085 dated Sep. 6, 2016, 8 pgs, no translation.
Notice of Allowance for Taiwan Patent Application No. 104138085 dated Jul. 19, 2018, 3 pgs, with English translation.
Office Action for Taiwan Patent Application No. 104138085 dated Nov. 16, 2017. 9 pages.
Bing Dang et al., "3D Chip Stack with Integrated Decoupling Capacitors" 2009 Electronic Components and Technology Conference, pp. 1-5.
O. Guiller et al., "Through Silicon Capacitor Co-Integrated with TSVs on Silicon Interposer" Microelectronic Engineering 120 (2014) pp. 121-126.
Notice of Allowance from Korean Patent Application No. 10-2015-0163793, dated Dec. 28, 2017, 3 pgs., no translation.
Notice of Allowance for German Patent Application No. 102015119892.4 dated Mar. 3, 2021, 10 pgs.

* cited by examiner

PASSIVE COMPONENTS IN VIAS IN A STACKED INTEGRATED CIRCUIT PACKAGE

CROSS-REFERENCE TO RELATED APPLICATION

This patent application is a divisional of U.S. patent application Ser. No. 14/583,015, filed Dec. 24, 2014, entitled "PASSIVE COMPONENTS IN VIAS IN A STACKED INTEGRATED CIRCUIT PACKAGE," the entire disclosure of which is hereby incorporated by reference in its entirety and for all purposes.

FIELD

The present description relates to the field of integrating passive components in vias of dies in a stacked processor package and in particular to integrating components for power delivery.

BACKGROUND

High power processor packages are developing to have more processing cores and processing cores of different types. These cores require power delivery from an external power supply. In many cases an integrated voltage regulator is included on a die as a part of a processing core. The voltage regulator requires large passive components such as inductors and capacitors that are placed in some external location. With more cores being used, more external passive components are required.

In other examples, the voltage regulator is in a separate die with the uncore circuitry (such as I/O, memory controller, and power control unit) and is packaged with the die stacked with the processor cores over the die and with a voltage regulator for each core. This allows more space in the die with the microprocessor cores to be made available and isolates the power circuitry from the core processing circuitry. Still the large passive inductors and capacitors for the voltage regulator are placed in some external location that is reached through vias, connection bumps, or some other means. The passive components provide higher Q factors when isolated from high speed digital circuitry and from high density interconnection grids. They also provide higher Q factors when they are made large compared to the components of the processing die or even the voltage regulator die. Also, the passive components perform better when they are located near the core processing circuitry.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In embodiments, inductors with magnetic material also known as magnetic core inductors (MCI) are integrated on a bottom (uncore) die of a 3D-stacked processor. The stacked processors are in topologies that are particularly suited for integrating a FIVR (Fully Integrated Voltage Regulator) into the dies. The uncore die includes uncore circuitry such as input/output circuitry, a memory controller, a power control unit, etc. Some embodiments may also include high density capacitors on the back side of the bottom (uncore) die as an alternative to or in addition to multi-layer MIM (Metal-Insulator-Metal) capacitors on the top (core) die. This approach simplifies the package design because the package requires fewer layers and fewer design restrictions. This approach also opens up more room on the package for effective VIN (Input Voltage) decoupling capacitors. While the bottom (uncore) die is made more complex by the addition of the inductors, it is simplified by removing connections through the bottom die between the FIVR circuitry and the inductors in the package.

Magnetic core inductors may be integrated either on the back-side or the front side of the uncore (bottom) die. This avoids having the FIVR output go from the top or bottom die back into the package to connect to inductors in the package. It also reduces the number of connection bumps on the uncore (bottom) die. The MCIs on the bottom die can provide twenty or thirty times higher inductance density and a significantly smaller volume and thickness as compared to the ACI in the package, which alleviates the impact of the core area scaling. For a FIVR design located on the bottom die to supply power to cores on the top die, the best location for the inductors is in the same bottom die. High density 3D MIM capacitors and planar MIM capacitors may also be added on the back or front of the bottom (uncore) die to avoid the cost and complexity of fabricating the multi-layer MIM capacitors on the top die. In addition, by including the MCI in the same die with the FIVR, the FIVR may be tested independently of the package assembly.

Figure 1:
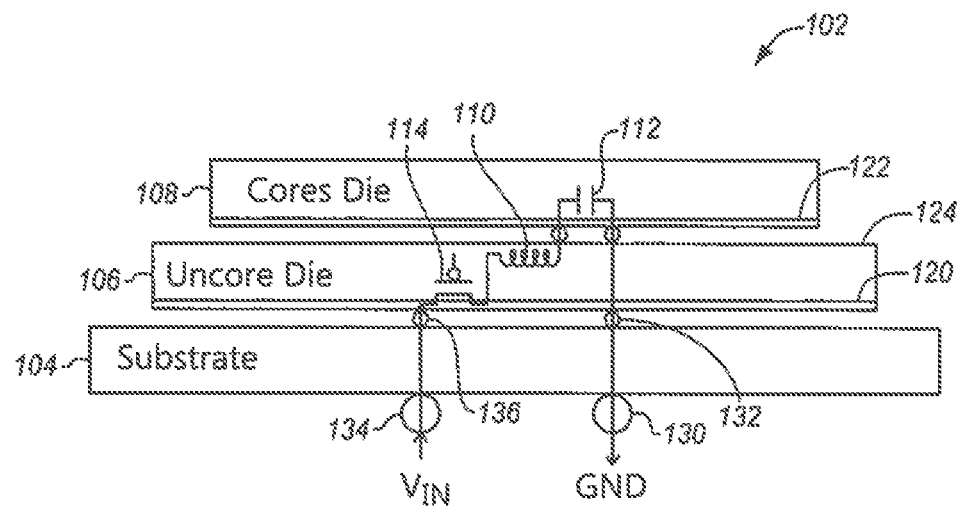
FIG. 1 is a cross-sectional side view diagram of a 3-D stacked face to back package with power delivery components on first and second dies according to an embodiment.

FIG. 1 is a side cross-sectional diagram of a 3D-stacked server configuration package 102. There is a package substrate 104 or substrate to be coupled to a circuit board directly or through a socket. The substrate may be formed of ceramic, silicon, build-up layers, or any other material to provide connection pads on the top 132, 136 and bottom 130, 134 surfaces of the substrate as well as connection routing between the top and bottom and some circuit components on or in the substrate. An uncore die 106 is connected to the substrate and located over the substrate. A cores die 108 is coupled to the uncore die and located over the uncore die. The uncore die typically provides power management, input/output signaling, and other functions for the cores die. While the lower die is referred to herein as an uncore die, any other type of supporting die may be used that performs similar functions and the die may be called by different names. The uncore die may also include processing resources, radio, amplifier, or other types of circuitry used, for example, in a system on a chip (SOC).

The cores die provides high speed computational and processing functions using one or more processing cores integrated onto a die. The cores die is attached such that the circuitry 122 is facing towards the substrate which allows for a heat sink 124 to be attached to the backside of the cores die. There may be different types of cores that are optimized for different functions, including general purpose computing, digital signal processing, and graphics processing cores. The specific functions of the dies may be adapted to suit different applications. There may be more cores dies and there may be additional dies over the uncore for other functions such as memory, input/output signaling, co-processing, etc.

There is a FIVR block (not shown) on each landing slot (not shown) in the uncore (bottom) die that powers the core located directly above it. There are also FIVR blocks that power the uncore die itself. The techniques presented herein may be applied to integrated LC filter components for FIVR components regardless of the components that are being powered. In addition, while the description herein is generally directed to a FIVR, the described structures and techniques may be adapted to other types of voltage regulators or voltage converters. The voltage regulators may be a switching voltage regulator (commonly known as a buck voltage regulator), a switched capacitor voltage regulator, a charge pump, a low drop-out voltage regulator, a linear voltage regulator or a combination of these types of voltage regulators such as a hybrid switch capacitor combined. Not all of these types of voltage regulators use inductors, but capacitors are typically used in all voltage regulators to reduce noise from circuit switching. The particular choice of passive device may be adapted to suit the corresponding power supply circuit. The use of the term "FIVR" is not intended to require any particular voltage regulator circuitry, connections or components.

The uncore die 106 is attached to the substrate so that the front side of the die is facing the substrate. This allows circuitry 120 of the front side of the die to be directly coupled to the substrate through mating connection pads 132, 136. As mentioned above, this circuitry may include power, clocking, input/output, and other circuitry depending on the particular application. The cores die similarly is attached to the uncore die so that the front side of the cores die is facing the back side of the uncore die. This may be referred to as a F2B (front-to-back or face-to-back) configuration. The circuitry 122 of the cores die is coupled directly to the back side of the uncore die and may be connected to the circuitry of the uncore die using TSVs (Through-Silicon Vias) or any of a variety of other techniques.

A magnetic core inductor 110 is integrated on the back side of the uncore die, while high-density MIM capacitors 112 are integrated in the top die. The capacitors may be formed using any of a variety of different techniques including a multi-layer planar design. The input voltage VIN from an external source, typically but not necessarily on the circuit board, is coupled through a pad 134 to the substrate 104 and through substrate connections 136 to a voltage regulator circuit 114 such as a FIVR. The voltage regulator couples the power to the MCI 110 and then through the capacitor 112 to power at least a part of the cores die. The return path for the current from the cores die and the connections to the capacitor are looped back through a substrate connection 132 through the substrate to a ground connection GND 130 through the uncore die and the substrate.

The voltage regulator circuit is represented by a transistor 114 to suggest a pulse width modulation (PWM) of the power supplied to the cores die 108. In some embodiments, the regulated power supply will be based around one or more switched power transistors to generate a controllable duty cycle of the input voltage. The operation of the switching power transistor is controlled by a power regulation circuit (not shown) that receives a control signal to drive the transistor gate. The power supply pulses are then supplied to the inductors 110 and capacitors 112 to even out the pulsed power to a constant voltage level. Other types of power supplies may be used as alternatives to suit particular cores.

While the present disclosure is provided in the context of a FIVR or other type of voltage regulator, the described configurations and embodiments may be applied to a variety of different power supply circuits and systems and to passive components for any such system. The power supply circuit 114 may be voltage regulator as described, a voltage converter, or any other type of power supply circuit. Similarly while both an inductor 110 and a capacitor 112 are shown, the number and types of passive components and their connection with the circuitry may be adapted to suit the particular power supply circuit. While only one voltage regulator is shown there may be one or more voltage regulators for each processing core of the cores die. There may also be voltage regulators to power components in the uncore die. The cores die may have two or more processing cores of similar or different types. In one embodiment there may be 36 cores including high speed, low power, graphics, accelerators and FPGA (Field Programmable Gate Array) processors included in a single cores die. Other and additional cores may be used depending on the particular implementation.

The package of FIG. 1 and any of the other embodiments may be finished by adding a cover, a heat spreader, or some other or additional components. Alternatively, connections can be made using bonding wires around the perimeter of the uncore die to the package. The dies may be covered in molding compound for protection and stability. Additional parts such as amplifiers, radio frequency components, and digital signal processors may also be added on or in the package.

Figure 2:
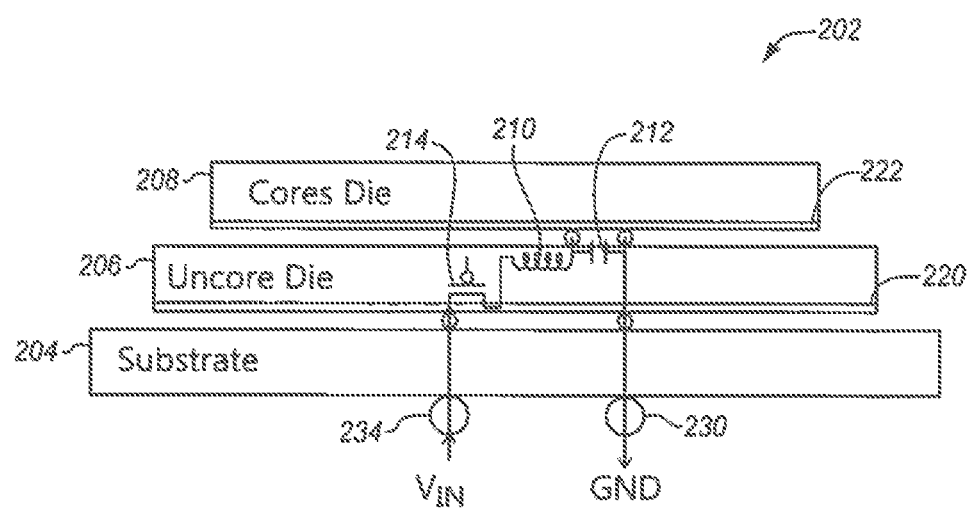
FIG. 2 is a cross-sectional side view diagram of an alternative stacked face-to-back package according to an embodiment.

FIG. 2 is a cross-sectional side view diagram of an alternative stacked server configuration package 202 in which a capacitor 212 has been moved from a cores die 208 to the back of an uncore (bottom) die 206. The capacitor may be formed in the same space as the inductor. The package has a package substrate 204 or substrate with the circuitry 220 of a front side of the uncore die facing and coupled to the substrate 204. Circuitry 222 of a front side of the cores die 208 is coupled to the back side of the uncore die.

The substrate is coupled to a VIN connector 234 directly or through a socket. The VIN is conditioned through a voltage regulator 214 to an inductor 210 on the back side of the uncore die. This inductor is constructed and positioned similar to the inductor 110 of FIG. 1. The inductor 210 is coupled to a capacitor 212 now on the back side of the uncore die to route power to the cores die and eventually looped back through the uncore die 206 and the substrate 204 to a GND connection 230. The positioning of the capacitor 212 on the uncore die further simplifies the construction of the cores die and further simplifies the connections between the uncore die and the cores die. The capacitor 212 can be a planar MIM capacitor or a 3D MIM capacitor.

Figure 3:
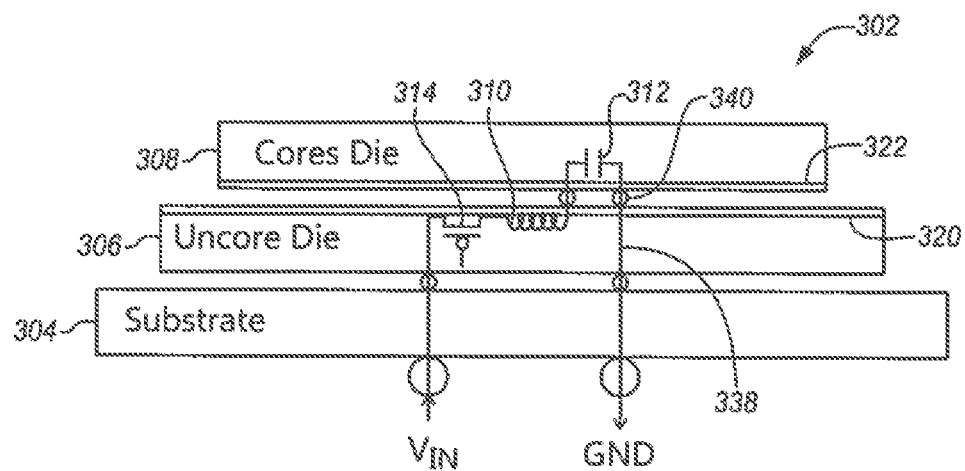
FIG. 3 is a cross-sectional side view diagram of a stacked face-to-face package according to an embodiment.

FIG. 3 is a similar cross-sectional side view diagram of an alternate implementation of a package suitable for F2F (face-to-face) stacking. In this embodiment, the package 302 has a substrate 304 with power, VIN, GND, and other external connections for data and control, for example. An uncore die 306 is coupled to the substrate through its back side. Through-silicon vias 338 connect the substrate through the back side of the die to a voltage regulator 314 on the front side of the die. Alternatively, bonding wire connected to the circuitry 320 around the perimeter of the uncore die 306 can be used to connect to the substrate. The front side of the uncore die faces the front side of a core die 308. The two dies are connected, for example using a solder ball grid or micro-bump solder grid 340. An inductor 310 is formed on the front side of the uncore die between the solder bumps and coupled to the voltage regulator. A capacitor 312 is formed on the front side of the cores die and coupled to the inductor through one or more of the solder ball connections. The capacitor is then coupled to circuitry of the front side of the die that forms a processing core.

In this example, the front side of the first die 306 is identified as the side that includes the circuitry 320 formed on the die through photolithography and other processes. Similarly, the front side of the second die 308 is identified as the side that includes the circuitry 322 formed on the second die.

Figure 4:
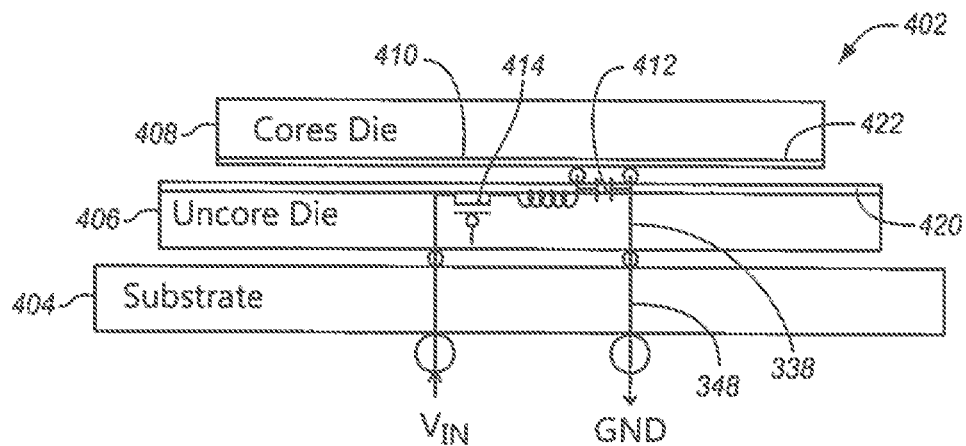
FIG. 4 is a cross-sectional side view diagram of an alternative stacked face-to-face package according to an embodiment.

The inductors 310 may be formed with magnetic material as MCIs (Magnetic Core Inductors or inductors with magnetic material) for example and the capacitors may be formed as MIM (Metal-Insulator-Metal) caps. Both may be fabricated on the front side or the top of the uncore die, the same side as the transistors. In the embodiments of FIGS. 3 and 4, the current through the TSVs 338 for VIN would be reduced compared to a TSV that carries current between a voltage regulator and the inductors and capacitors. The power prior to the voltage regulator has a higher voltage and lower current. As a result, in comparison to a system with the inductors in the substrate, fewer TSVs are required and the signals between the dies have a shorter distance to travel. Reducing the distance for die-to-die signal improves performance with lower cost because die-to-die signals likely have less buffering and less amplification and are likely to be more numerous.

FIG. 4 is a similar cross-sectional side view diagram to that of FIG. 3 in which the 412 capacitor has been moved from the front side of a cores die 408 to the front side of an uncore die 406. In addition, 3D high-density capacitors could be incorporated on the front side of the uncore die for use by the voltage regulator and on the backside of the uncore die for the input Vcc to the voltage regulator for decoupling.

In FIG. 4, the same F2F configuration of FIG. 3 is used. A package 402 has a first die 406 coupled to and over a substrate 404. A second die 408 is coupled to the first die in a F2F configuration so that the circuitry 420 of the first die is facing the circuitry 422 of the second die. The first die includes a voltage regulator 414 such as a FIVR, one or more inductors 410 and one or more capacitors 412 coupled to the voltage regulator. The inductors and capacitors are formed on the front side of the first die between solder bumps that connect the first and the second die to each other. In this embodiment as in the example of FIG. 3, vias 338 to external power run through the first die to the back side of the first die to connect to the substrate. Additional vias 348 run through the substrate to connect through solder bumps to the external power supply. As a result, the connections between the voltage regulator and the corresponding processing core are short and do not require any through-silicon vias. The connections to external power are comparatively long. Alternatively, bonding wires can be used along the perimeter of the uncore die to electrically connect to the substrate.

In FIGS. 1-4, the inductors and capacitors are placed in the gap between the uncore and cores dies. The vertical height of this space is typically determined by the height of the connections between the two dies. These connections may be metal micro-bump connections, solder bumps, molded studs, thermosonic or thermo-compression bonds using copper-copper, gold-gold, or other metals or electrically conductive polymers, or a tape-and-reel process. Wire bonds using, for example thermosonic bonding or wedge bonds, can also be used to connect the uncore die to the substrate. In some embodiments, a small space results from bonding between the uncore die and the substrate where there is no metal to metal contact. An electrically-insulating adhesive may be used as an underfill in this space. The underfill provides a stronger mechanical connection, provides a heat bridge, and ensures that the solder joints are not stressed due to differential heating of the chips. The underfill also distributes the thermal expansion mismatch between the chips.

Depending on the construction of the inductors and capacitors and the required L, C and other values, the height of the L and C components may be greater than the vertical gap created by the micro-bump connections. In order to provide more space for the L and C components, recesses may be formed on the corresponding surface of the appropriate die. The L and C components may then be formed in or positioned in these recesses.

Figure 5:
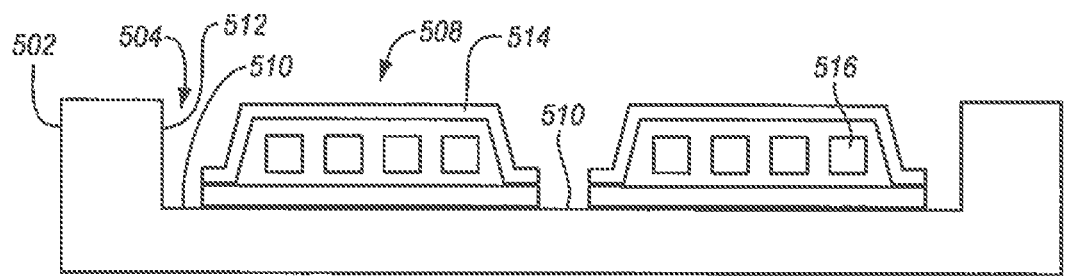
FIG. 5 is a cross-sectional side view diagram of magnetic core inductors formed in a recess of a die according to an embodiment.

FIG. 5 shows an example of a magnetic core inductor formed in a recess of a die. The same approach may be applied to capacitors and other types of inductors. The die 502 is shown in cross-section. A notch 504 has been cut in the die with a vertical wall 512 and a bottom floor 510. The notch is formed as a recess or indent by etching, drilling, laser machining, or by another process removing material from the die to form the recess or indentation. The notch increases the distance from the top die to the bottom floor of the notch in the uncore die. The integrated passive components may be built in one or more different notches on the back side or even the front side of the bottom die, depending on the package configuration.

As shown, a magnetic core inductor is 506 is formed or positioned in the notch. The inductor has copper windings 516 surrounded by magnetic core material 514. The inductors may be formed in any of a variety of different ways. The inductor device may be a stripe inductor, spiral inductor, solenoid inductor, torus inductor, an inductor formed in a V-groove etched into the silicon, or may be a coupled inductor or transformer. In some embodiments, the lower half of the magnetic material is first deposited. The copper conductors are formed over the lower half and then a top half is deposited. An insulator may be used to isolate the copper wires from the magnetic material. The inductors are coupled to wiring line traces (not shown) that traverse from the notch to an appropriate wiring line or solder bump of the uncore die. This wiring line allows the inductor to be coupled to the voltage regulator on one side and one or more capacitors on the other side or to any other components as may be desired depending on the implementation.

Figure 6:
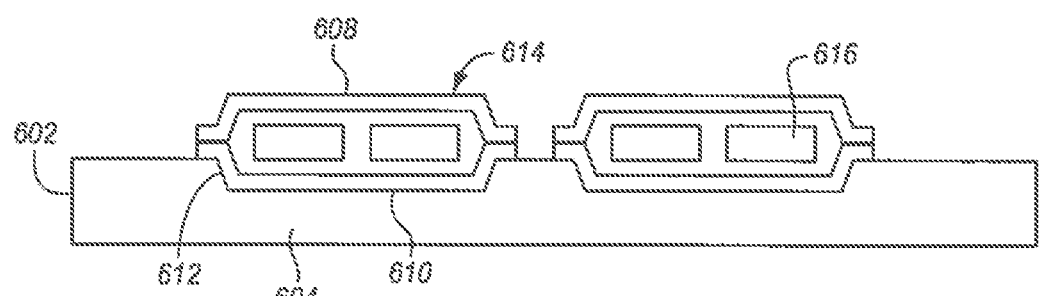
FIG. 6 is a cross-sectional side view diagram of magnetic core inductors formed in a recess of a die with angled side walls according to an embodiment.

FIG. 6 is a cross-sectional side view diagram of a further variation in which a notch 604 in a silicon die 602 may be tapered to improve the step coverage of the magnetic material 614 of an inductor 608 which improves the quality factor of the inductor. The notch has a bottom floor 610 and a side wall 612, but in this case the side wall is formed at an angle so that the walls taper in towards the floor of the notch. The magnetic core material 614 may then be formed for the lower half by depositing the core material directly over the bottom floor of the notch and up the angled side walls of the notch. This will improve the step coverage and the performance of the inductor by providing a better path for the magnetic flux. The copper windings 616 are formed over the lower half of the core and then the top half of the inductor is formed over the copper windings. As shown, each notch may be formed with a size to accommodate a single inductor. The process of forming the notch may be used to control the size of the inductor. As in the example of FIG. 5 wiring traces may be deposited or formed in any other way to connect the inductors to other components.

Figure 7:
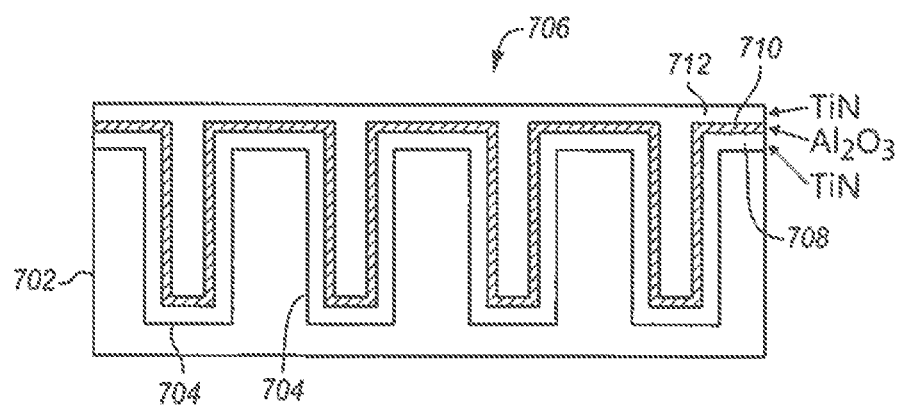
FIG. 7 is a cross-sectional side view diagram of magnetic core capacitors formed in pores of a die according to an embodiment.

High-density capacitors may also be formed in the surface of a silicon die. FIG. 7 shows a silicon die 702. Pores 704 may be etched into the front or back side of the uncore die 702 as shown to show a series of parallel channels or grooves. The channels may then be lined with a first conductor layer 708 such as TiN, TaN, Cu, or any other desired material. The first conductor layer may then be covered in a dielectric layer 710 such as Al2O3, HfO2, SiN, SiO2, or any other desired dielectric. The dielectric may then be covered with a second conductor layer 712 of the same or a different material as the first layer 708. In the example of FIG. 7, the pores are completely filled with the second conductor layer. Depositions techniques for forming these layers in 3D trenches or on planar surfaces include atomic layer deposition (ALD), electroplating, electroless plating, chemical vapor deposition (CVD) sputtering, and evaporation.

The resulting MIM capacitor takes very little of the vertical space between the dies because most of its material is embedded into the pores cut into the die. The alternating layers of metal and insulator may be formed to produce a particular capacitance. These capacitors can be formed either on the uncore as in FIGS. 2 and 4 or on the cored die as in FIGS. 1 and 3. The may be used for a voltage regulator output. They may also be used for the input voltage VIN of the microchip as decoupling capacitors. The thickness of the dielectric may be adjusted to accommodate the higher voltages for the input voltage separately from the output voltage.

Figure 8:
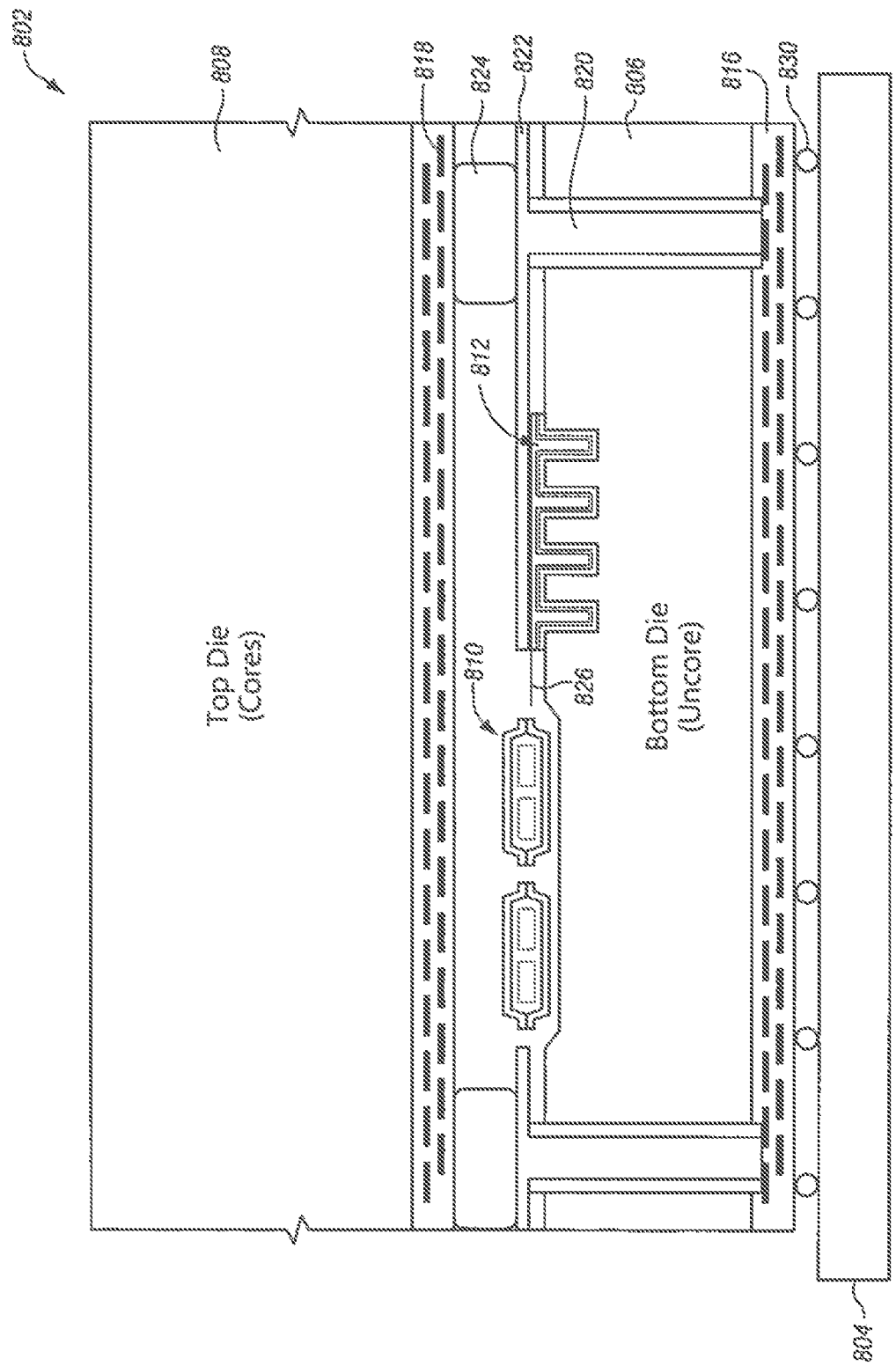
FIG. 8 is a cross-sectional side view diagram of stacked face-to-back package mounted to a substrate according to an embodiment.

FIG. 8 is a cross-sectional side view diagram of parts of a 3-D stacked F2B package 802 that includes magnetic core inductors 810 and 3D MIM capacitors 812 integrated in the 3D-stacked system using a face-to-back stacking. Both the inductors and capacitors are embedded in the back side of a bottom die 806, to enable a natural path from a FIVR circuit in a circuitry layer 816 of the bottom die to a load in a circuitry layer 818 of the top die.

A redistribution layer 822 may be formed on the back side of the die to connect the inductors and capacitors between TSVs 820 on the bottom die 806 and micro-bumps 824 on the top die 808. The TSVs connect the inductors and capacitors to the voltage regulator on the front side of the bottom die. Specific routing layers 826 may be used to connect the inductors 810 to the capacitors 812. The bottom die is also coupled to a substrate 804 for connection to external components. The redistribution layer 822 may also be used as a heat spreader to help remove heat generated by the uncore die. A heat sink (not shown) may be added to make contact with the perimeter of the uncore die. The uncore die may be made larger than the cores die to provide a simpler physical contact with the uncore die.

The stacked packages described herein provide significant benefits. As an example, area scaling concerns are alleviated for FIVR LC filter components that have to fit in the footprint of one core. By forming or positioning the LC filter components on or in the bottom die, high Q factors can be obtained without forcing higher precision on the simpler substrate and without consuming extensive space on the high speed dense fabrication technology processing core.

By removing the LC components from the substrate, the cost and complexity of the substrate is reduced. In addition, fewer connection bumps are required on the uncore die to support the FIVR support. Instead of connecting to LC passive components in the substrate using bumps, the FIVR connects directly to LC components using TSVs and redistribution layers in the top core. The connection bumps to the substrate of the top die are no longer needed.

Figure 9:
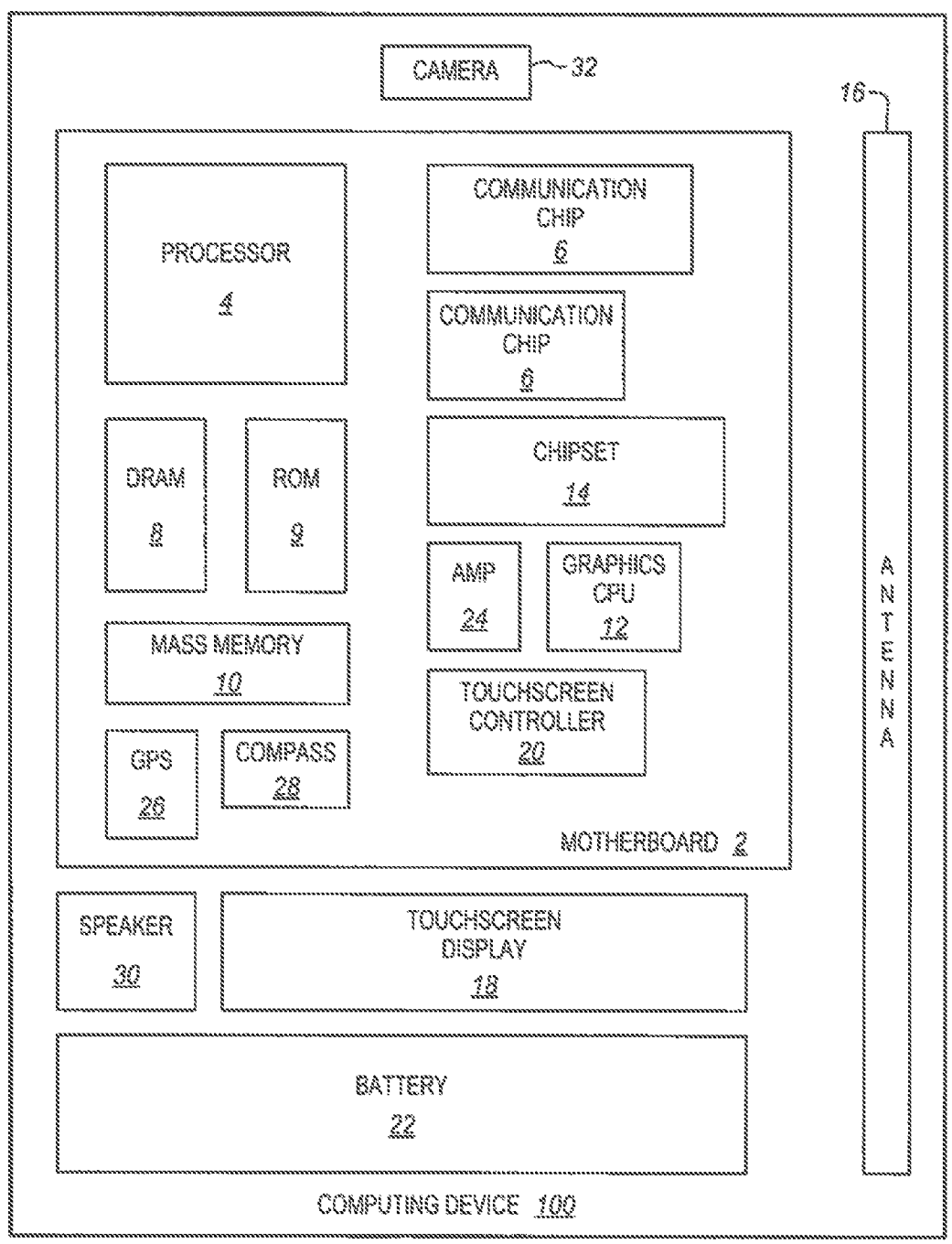
FIG. 9 is a block diagram of a computing device incorporating a package with passive components according to an embodiment.

FIG. 9 illustrates a computing device 100 in accordance with one implementation of the invention. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

Any one or more of the chips may be packaged as described herein or several of the chips may be combined into a single package using passive components for power delivery as described.

In various implementations, the computing device 100 may be a server, a workstation, a laptop, a netbook, a notebook, an ultrabook, a smartphone, a tablet, a personal digital assistant (PDA), an ultra mobile PC, a mobile phone, a printer, a scanner, a monitor, a set-top box, an entertainment control unit, a digital camera, a portable music player, or a digital video recorder or devices termed internet of things (IoT). In further implementations, the computing device 100 may be any other electronic device, such as a pen, a wallet, a watch, or an appliance that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

In another embodiment a via-first approach may be used to create low cost through-silicon vias (TSV). The TSVs are then lined with a high k dielectric material such as HSG Poly or Ta2O5. An electrode is inserted into each lined via to form high-density capacitors which can then be used for in chip de-cap purposes.

Since this is a via-first process, higher deposition temperatures can be used for depositing the dielectric films, which opens up the possibility of using high-k dielectric oxides, which are typically deposited at higher temperatures. The TSV can alternatively be lined with a magnetic material to produce an inductor which can then be connected using standard interconnect processes to the right circuit locations. Vias can be used to provide both capacitors and inductors coupled using a redistribution layer or copper traces. This provides a path to integrating passive circuits within via of the silicon of the uncore die.

Figure 10:
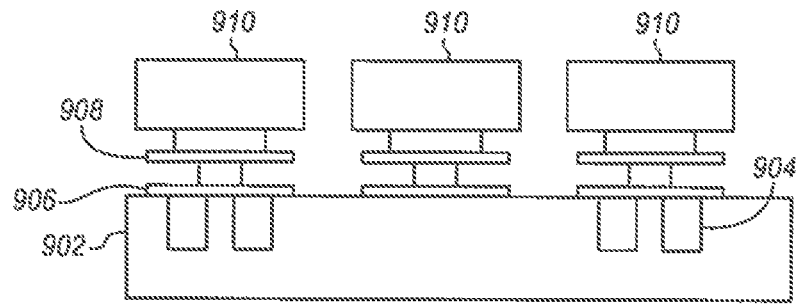
FIG. 10 is a cross-sectional partial diagram of the back side of a silicon die with passive devices in silicon vias according to an embodiment.

FIG. 10 is a cross-sectional partial diagram of the back side of a silicon die 902 such as an uncore die, with through-silicon vias 904. The vias are filled to form passive devices and then a patterned conductive layer 906, such as copper traces is formed to connect the passive devices to each other and to other circuitry to support any desired connections. Additional patterned layers 908 are formed over layers of dielectric to form a redistribution layer over the vias 904.

Connection pads 910 may be formed over the redistribution layer to allow the passive devices in the vias to be coupled to other components and to provide other connections to other vias or other circuits. As mentioned above, the passive devices may be coupled between a power supply circuit and an uncore die. Both the power supply circuit and the uncore die may be connected using the redistribution layer or in another way, including wire bonds. The uncore die 902 with vias may be used as shown in FIGS. 1-4 to provide some or all of the passive devices. By forming the passive devices in through-silicon vias, the passive devices do not require any space on an exterior surface of a die as described above.

A passive device, such as a capacitor, may be formed in a variety of different ways. In one example, deep holes are first etched by deep reactive ion etching. A dielectric passivation layer such as a silicon dioxide may then be deposited in the deep holes. A metal-insulator-metal structure may then be formed over the passivation layer. TiN may be deposited by metal organic chemical vapor deposition followed by a dielectric such as an aluminum oxide followed by another layer of metal. A via first process may allow for a higher dielectric value material to be used to increase the capacitance of the device.

Patterned plasma etching may then be used to clear the top of the silicon die and to reveal a portion of the bottom metal layer. This allows for a top side electrodes to be attached over the via. The via may be further filled with a dielectric to isolate the top metal layer. An inductor may be formed in a similar way using a M-I-M structure.

Figure 11:
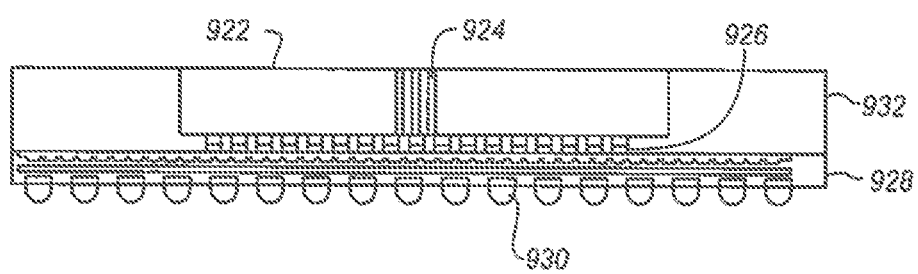
FIG. 11 is a cross-sectional side view diagram of an overmolded die with vias according to an embodiment.
Figure 12:
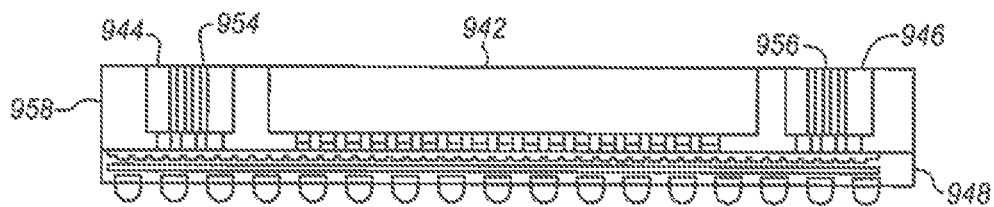
FIG. 12 is a cross-sectional side view diagram of multiple dies with a single overmold according to an embodiment.

In some embodiments, the silicon die can be molded before thinning to enable easier handling and greater strength. FIG. 11 is a side cross-sectional side view diagram of a die 922 with a front side circuitry and connection layer 926 coupled to a substrate 928 using C4, BGA, or any of a variety of other connection systems. The substrate also has a larger pitch connection array 930 such as a BGA, surface mount, or any other type to attach to an external device such as a motherboard or even another die. This die may be the uncore die or the cores die as described herein.

The die 922 has TSVs 924 formed therein which may allow for the connection of other devices and which may contain passive devices. The die and the substrate are also overmolded with a molding compound or encapsulant 932. The mold compound may be a filled epoxy resin or any of a variety of other polymers and other materials. The mold compound 932 is applied over the mounted die and then the back side of the die, shown as the top in FIG. 11, may be thinned. This allows the various stacked configurations of FIGS. 1-4 to be less high. Depending on the nature of the die 922, as shown it is ready to be stacked over a cores die, or to have the uncore die stacked over it.

FIG. 11 is a cross-sectional side view diagram of an alternative configuration in which there are three dies 942, 944, 946 attached to a substrate 948. The dies are all attached to the substrate in the same way as in FIG. 10, however the embodiments are not so limited. The dies include TSVs 954, 956 in one or all of the dies and the dies are overmolded with an encapsulant 958. This allows all three dies to be thinned with the encapsulant at the same time and in a single operation. As mentioned above, the stacked dies of FIGS. 1-4 may have more than one die at each level of the stack. The embodiment of FIG. 11 allows the dies to be held securely in place by the encapsulant for use as the bottom or the top layer of the stacked die package.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an embodiment that has a substrate, a first die coupled to the substrate over the substrate, the first die including a power supply circuit coupled to the substrate to receive power, a second die having a processing core and coupled to the first die over the first die, the first die being coupled to the power supply circuit to power the processing core, a via through the first die, and a passive device formed in the via of the first die and coupled to the power supply circuit.

In some embodiments the first die has a front side including circuitry facing the substrate and a back side facing the second die and wherein the passive device is positioned in a through-silicon via on the back side.

In some embodiments the front side of the first die is coupled to the second die using additional through-silicon coupling vias through the first die.

In some embodiments the back side of the first die is coupled to the substrate using bonding wires.

In some embodiments the passive device is formed by a high k dielectric material lining the via and an electrode within the lining to form a capacitor.

In some embodiments the passive device is formed by a magnetic inductor material lining the via and an electrode within the lining to form an inductor.

In some embodiments the passive device includes capacitors coupled to inductors, the capacitors and the inductors being formed in vias of the first die.

In some embodiments the first die is a silicon die and wherein the capacitors are metal-insulator-metal capacitors.

In some embodiments the passive device comprises either 3D metal-insulator-metal capacitors, planar metal-insulator-metal capacitors, magnetic core inductors, stripe inductors, spiral inductors, solenoid inductors, or torus inductors.

In some embodiments the power supply circuit comprises either a voltage converter, a switched capacitor voltage converter, a voltage regulator or a fully integrated voltage regulator.

In some embodiments the passive device is formed in the via before power supply circuit is formed.

Further embodiments include a molding compound over the first and second die to physically isolate and protect the dies.

Some embodiments pertain to a stacked die package that includes a cores die having a plurality of processing cores, an uncore die having a power supply circuit for each processing core, each power supply circuit being independently coupled to each respective processing core to supply power to the respective processing core, a package substrate coupled to the uncore die to receive power from an external source and to provide power to the power supply circuits of the uncore die, a first plurality of through-silicon vias through the uncore die to carry data signals from the cores die to the package substrate, and a second plurality of through-silicon vias through the uncore die in which passive devices are formed, the passive devices being coupled to a power supply circuit.

In some embodiments the plurality of passive devices are capacitors attached formed in the front side of the uncore die by a dielectric lining in each via and an electrode within the lining.

Some embodiments pertain to a computing device that includes a system board, a communication package connected to the system board, and a processor package having a substrate, an uncore die coupled to the substrate over the substrate, the uncore die including a power supply circuit coupled to the substrate to receive power, a cores die having a processing core and coupled to the uncore die over the uncore die, the uncore die being coupled to the power supply circuit to power the processing core, a via through the first die, and a passive device formed in the via of the first die and coupled to the power supply circuit.

In some embodiments the uncore die has a front side including circuitry facing the cores die and a back side facing the substrate, wherein the via is formed in the front side of the uncore die.

In some embodiments the passive device includes capacitors coupled to inductors, the capacitors and the inductors being formed in vias of the first die.

Some embodiments pertain to a method that includes forming a plurality of vias in a silicon wafer, forming passive devices in a portion of the plurality of vias, forming power supply circuits on the wafer after forming the passive devices, dicing the wafer to produce a plurality of uncore dies each having a power supply circuit, attaching one of the plurality of uncore dies to a substrate, attaching a cores die having a processing core to the uncore die over the uncore die, the cores die being coupled to the power supply circuit through the passive device of the uncore die to power the processing core.

Some embodiments pertain to an apparatus that includes a substrate, a first die coupled to the substrate over the substrate, the first die including a power supply circuit coupled to the substrate to receive power, a molding compound over the first die to physically isolate and protect the first die during thinning, a second die having a processing core and coupled to the first die over the first die an over the molding compound, the first die being coupled to the power supply circuit to power the processing core, and a passive device attached to the first die and coupled to the power supply circuit.

Further embodiments include a via through the first die and a passive device formed in the via of the first die and coupled to the power supply circuit.

The invention claimed is:
1. A method comprising:
forming a plurality of vias in a silicon wafer;

forming passive devices in a portion of the plurality of vias, wherein forming passive devices in the portion of the plurality of vias comprises forming a capacitor in one of the plurality of vias;

forming power supply circuits on the silicon wafer from the passive devices after forming the passive devices;

dicing the silicon wafer to produce a plurality of uncore dies each having a power supply circuit;

attaching one of the plurality of uncore dies to a substrate; and attaching a cores die having a processing core to the uncore die, the cores die over the uncore die, the cores die being coupled to the power supply circuit through the passive devices of the uncore die to power the processing core.

2. The method of claim 1, further comprising overmolding the one of the plurality of uncore dies and the substrate with a molding compound or encapsulant.

3. The method of claim 1, wherein forming passive devices in the portion of the plurality of vias comprises forming an inductor in one of the plurality of vias.

4. A method comprising:

forming a plurality of vias in a silicon wafer;

forming passive devices in or on the silicon wafer, wherein forming passive devices in or on the silicon wafer comprises forming a capacitor in or on the silicon wafer;

forming power supply circuits on the silicon wafer from the passive devices;

dicing the silicon wafer to produce a plurality of uncore dies each having a power supply circuit;

attaching one of the plurality of uncore dies to a substrate; and attaching a cores die having a processing core to the uncore die, the cores die over the uncore die, the cores die being coupled to the power supply circuit through the passive devices of the uncore die to power the processing core.

5. The method of claim 4, further comprising:

forming a capacitor in the cores die; and coupling the capacitor to the power supply circuit.

6. The method of claim 4, wherein forming passive devices in or on the silicon wafer comprises forming an inductor in or on the silicon wafer.

7. The method of claim 6, wherein forming the inductor in or on the silicon wafer comprises forming a recess in the silicon wafer, and forming a magnetic inductor in the recess.

8. The method of claim 7, wherein forming the recess comprises forming a recess having a bottom and angled sidewalls.

9. The method of claim 8, wherein forming the magnetic inductor in the recess comprises forming only a portion of the magnetic inductor in the recess.

10. The method of claim 7, wherein forming the recess comprises forming a recess having a bottom and vertical sidewalls.

11. The method of claim 10, wherein forming the magnetic inductor in the recess comprises forming an entirety of the magnetic inductor in the recess.

12. The method of claim 4, further comprising overmolding the one of the plurality of uncore dies and the substrate with a molding compound or encapsulant.

13. The method of claim 4, wherein forming the capacitor in or on the silicon wafer comprises forming a high density MIM capacitor embedded in the silicon wafer.

14. The method of claim 13, wherein forming the high density MIM capacitor comprises forming a series of parallel channels or grooves in the silicon wafer, forming a first conductor layer in the series of parallel channels or grooves, forming a dielectric layer on the first conductor layer, and forming a second conductor layer on the dielectric layer.

15. The method of claim 14, wherein forming the dielectric layer comprises forming a dielectric selected from the group consisting of $Al_2O_3$ and $HfO_2$.

16. The method of claim 14, wherein the first conductor layer and the second conductor layer are a same material.

17. The method of claim 14, wherein the first conductor layer and the second conductor layer are a different material.

18. The method of claim 6, wherein forming the inductor in or on the silicon wafer comprises forming a recess in the silicon wafer, and forming a magnetic inductor in the recess, and wherein forming the capacitor in or on the silicon wafer comprises forming a high density MIM capacitor embedded in the silicon wafer.

* * * * *